(12) United States Patent
Manabe et al.

(10) Patent No.: US 10,972,687 B2
(45) Date of Patent: Apr. 6, 2021

(54) IMAGE SENSOR WITH BOOSTED PHOTODIODES FOR TIME OF FLIGHT MEASUREMENTS

(71) Applicant: OmniVision Technologies, Inc., Santa Clara, CA (US)

(72) Inventors: Sohei Manabe, San Jose, CA (US); Keiji Mabuchi, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/870,159

(22) Filed: May 8, 2020

(65) Prior Publication Data

US 2020/0264309 A1 Aug. 20, 2020

Related U.S. Application Data

(62) Division of application No. 15/972,409, filed on May 7, 2018, now Pat. No. 10,684,373.

(51) Int. Cl.
*H01L 27/146* (2006.01)
*H04N 5/353* (2011.01)
(Continued)

(52) U.S. Cl.
CPC ........... *H04N 5/353* (2013.01); *G01S 7/4863* (2013.01); *G01S 17/894* (2020.01);
(Continued)

(58) Field of Classification Search
CPC ....... H01L 27/14609; H01L 271/14636; H01L 27/14645; H01L 27/1464; H01L 27/14643;
(Continued)

(56) References Cited

U.S. PATENT DOCUMENTS 8,089,036 B2 1/2012 Manabe
8,686,367 B2 4/2014 Shah
(Continued)

FOREIGN PATENT DOCUMENTS

TW 201711175 A 3/2017

OTHER PUBLICATIONS (ROC) Taiwan Patent Application No. 108115499—Office Action with English Translation dated Jun. 11, 2020, 6 pages.

*Primary Examiner* — Don K Wong
(74) *Attorney, Agent, or Firm* — Christensen O'Connor Johnson Kindness PLLC

(57) ABSTRACT

An image sensor including a photodiode, a first doped region, a second doped region, a first storage node, a second storage node, a first vertical transfer gate, and a second vertical transfer gate is presented. The photodiode is disposed in a semiconductor material to convert image light to an electric signal. The first doped region and the second doped region are disposed in the semiconductor material between a first side of the semiconductor material and the photodiode. The first doped region is positioned between the first storage node and the second storage node while the second doped region is positioned between the second storage node and the first doped region. The vertical transfer gates are coupled between the photodiode to transfer the electric signal from the photodiode to a respective one of the storage nodes in response to a signal.

6 Claims, 15 Drawing Sheets

(51) Int. Cl.
    *H04N 5/374* (2011.01)
    *G01S 7/4863* (2020.01)
    *H04N 5/378* (2011.01)
    *H04N 13/254* (2018.01)
    *G01S 17/894* (2020.01)

(52) U.S. Cl.
    CPC ...... *H01L 27/1461* (2013.01); *H01L 27/1463* (2013.01); *H01L 27/14643* (2013.01); *H04N 5/378* (2013.01); *H04N 5/3742* (2013.01); *H04N 13/254* (2018.05)

(58) Field of Classification Search
    CPC .. H01L 27/1461; H04N 5/374; H04N 13/254; H04N 5/3742; G01S 17/89
    See application file for complete search history.

(56) References Cited

U.S. PATENT DOCUMENTS

| | | |
|---|---|---|
| 2013/0181119 A1 | 7/2013 | Bikumandla et al. |
| 2014/0225173 A1 | 8/2014 | Kim et al. |
| 2018/0294305 A1 | 10/2018 | Janssens et al. |
| 2019/0237499 A1* | 8/2019 | Roy .................. H01L 27/14641 |

* cited by examiner

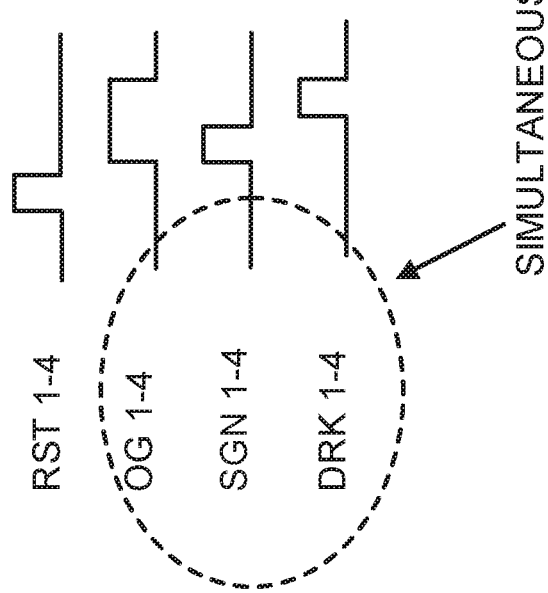

US 10,972,687 B2

IMAGE SENSOR WITH BOOSTED PHOTODIODES FOR TIME OF FLIGHT MEASUREMENTS

CROSS-REFERENCE TO RELATED APPLICATIONS

This application is a divisional of U.S. application Ser. No. 15/972,409, filed May 7, 2018, which is hereby incorporated by reference in its entirety.

TECHNICAL FIELD

This disclosure relates generally to semiconductor devices, and in particular but not exclusively, relates to time of flight image sensors.

BACKGROUND INFORMATION

Interest in three dimension (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on time of flight measurements are sometimes utilized. Time of flight cameras typically employ a light source that directs light at an object, a sensor that detects the light that is reflected from the object, and a processing unit that calculates the distance to the object based on the round-trip time it takes for the light to travel to and from the object.

A continuing challenge with the acquisition of 3D images is balancing the desired performance parameters of the time of flight camera with the physical size and power constraints of the system. For example, the power requirements of time of flight systems meant for imaging near and far objects may be considerably different. These challenges are further complicated by extrinsic parameters (e.g., desired frame rate of the camera, depth resolution, and lateral resolution) and intrinsic parameters (e.g., quantum efficiency of the sensor, fill factor, jitter, and noise).

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 5B is a timing diagram for signal readout of the pixel circuit included in FIG. 5A, in accordance with the teachings of the present disclosure.

Figure 1:
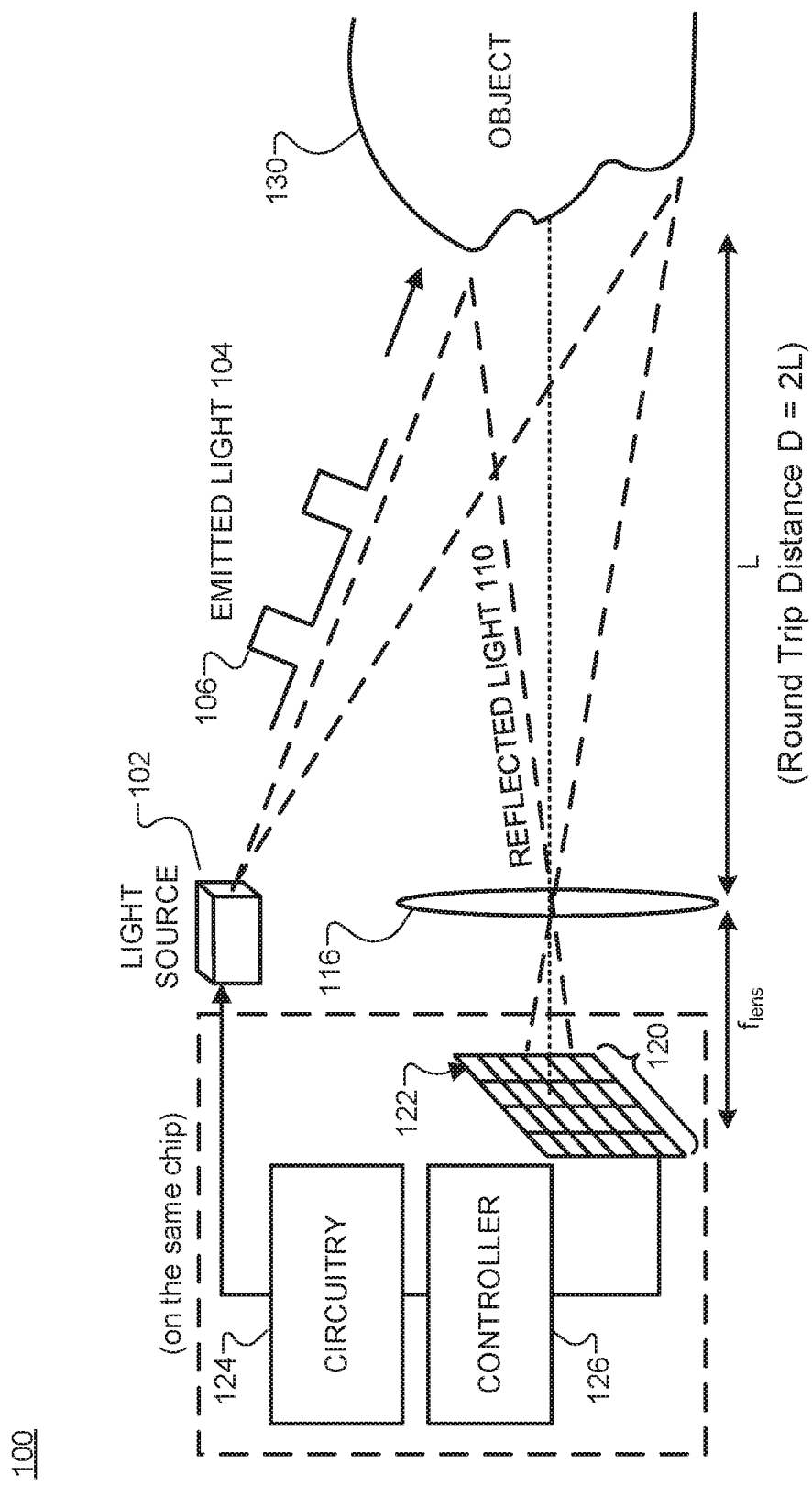
FIG. 1 is a block diagram that shows one example of a time of flight camera, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus, system, and method for an image sensor with boosted photodiodes for time of flight measurements are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In the various embodiments of the disclosure, a time of flight camera or image sensor having an increased speed in which signal electrons are transferred from a photodiode to a storage node. To increase the transfer speed of the signal electrons, an electric field is provided in the vertical and horizontal direction at the photodiode. This electric field is oriented to increase a drift velocity of the signal electrons from the photodiode towards the storage node. In some embodiments, the electric field is formed by a built-in potential between components (e.g., the photodiode and the storage node). In the same or other embodiments, a boost technique is utilized. The boost technique uses a junction capacitance of a p-n junction (e.g., a reversed biased diode) to form a horizontal electric field to increase the drift velocity of the signal electrons. One advantage of utilizing the junction capacitance over capacitance from a MOS capacitor is that the p-n junction may have smaller physical dimension requirements relative to the MOS capacitor.

In some embodiments, a time of flight image sensor includes a photodiode corresponding to a plurality of smaller photodiodes, each electrically coupled together. Each of the plurality of smaller photodiodes is boosted by coupling capacitance arising from the p-n junction. The coupling capacitance is attributed to junction capacitance of the p-n junction in response to being reverse biased. Due, at least in part, to the junction capacitance, the photodiode has an electric field in the horizontal (e.g., lateral) direction which accelerates the signal electrodes to the storage node via a transfer gate with an operation similar to that of a charge-coupled device (CCD). The coupling capacitances or junction capacitances are isolated by a shallow trench isolation structure to reduce leakage current from the photodiode. In some embodiments, the transfer gate is a vertical transfer gate. In one embodiment, the junction capacitance per unit area may be significantly less than MOS capacitance per unit area.

In the same or other embodiments, the time of flight image sensor features low driving voltage and low power consumption. For example, in some embodiments, the transfer gate voltage may be less than two volts due, at least in part, to being a vertical transfer gate. Low power consumption may be obtained due to the low voltage operation with transfer gate voltage less than two volts and coupling capacitance voltage swing also being less than two volts. The low power consumption may further be attributed to the small boost capacitor (e.g., the junction capacitance of the p-n junction). The low power consumption may be further attributed to a small transfer gate size, which can be utilized due to the CCD-like operation of the image sensor.

FIG. 1 is a block diagram that shows one example of a time of flight camera 100, in accordance with the teachings of the present disclosure. Time of flight camera 100 includes light source 102, lens 116, image sensor 120 (including a plurality of pixels such as first pixel 122), circuitry 124, and controller 126. Controller 126 is coupled to light source 102, circuitry 124, and image sensor 120. Image sensor 120 is positioned at a focal length $f_{lens}$ from lens 116. As shown in the example, light source 102 and lens 116 are positioned at a distance L from object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L+focal length $f_{lens}$ are substantially equal for the purposes of time of flight measurements in accordance with the teachings of the present invention. As illustrated, image sensor 120, circuitry 124, and controller 126 are represented as separate components. However, it is appreciated that image sensor 120, circuitry 124, and controller 126 may all be integrated onto a same stacked chip sensor. In other embodiments, image sensor 120, circuitry 124, and controller 126 may be integrated onto a non-stacked standard planar sensor. Furthermore, it is appreciated that circuitry 124 may include one or more of time-to-digital converters. In some embodiments, each pixel may include one or more avalanche photodiodes (e.g., single-photon avalanche diode) that may be associated with a corresponding one of one or more time-to-digital converters. It is also appreciated, that in some embodiments, individual time-to-digital converters may be associated with any pre-determined number of pixels. Furthermore, it is appreciated that each pixel may have a corresponding memory for storing digital bits or signals for counting detected photons from the avalanche photodiode.

Time of flight camera 100 is a 3D camera that calculates image depth information of a scene to be imaged (e.g., object 130) based on time of flight measurements with image sensor 120. Each pixel of the plurality of pixels in the image sensor 120 determines depth information for a corresponding portion of object 130 such that a 3D image of object 130 can be generated. Depth information is determined by measuring a round-trip time for light to propagate from light source 102 to object 130 and back to time of flight camera 100. The depth information may be based on an electric signal generated by the image sensor 120 (e.g., the first pixel 122) that is subsequently transferred to a storage node. As illustrated, light source 102 (e.g., a light emitting diode, a vertical-cavity surface-emitting laser, and the like) is configured to emit light 104 (e.g., first pulses 106) to the object 130 over a distance L. The emitted light 104 is then reflected from the object 130 as reflected light 110, some of which propagates towards the time of flight camera 100 over the distance L and is incident upon the image sensor 120 as image light. Each pixel (e.g., the first pixel 122) of the plurality of pixels included in the image sensor 120 includes a photodetector (e.g., one or more photodiodes, avalanche photodiodes, or single-photon avalanche diodes) to detect the image light and convert the image light into an electric signal (e.g., signal electrons, image charge, etc.).

As shown in the depicted example, the round-trip time for pulses (e.g., the first pulses 106) of the emitted light 104 to propagate from light source 102 to object 130 and back to image sensor 120 can be used to determine the distance L using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ corresponds to the round-trip time which is the amount of time that it takes for pulses of the light to travel to and from the object as shown in FIG. 1. Accordingly, once the round-trip time is known, the distance L may be calculated and subsequently used to determine depth information of object 130.

Controller 126 is coupled to image sensor 120 (including first pixel 122), circuitry 124, and light source 102 and includes logic that when executed causes time of flight camera 100 to perform operations for determining the round-trip time. Determining the round-trip time may be based on, at least in part, timing signals generated by circuitry 124. The timing signals are representative of when light source 102 emits light and when the photodetector detects the image light.

In some examples, time of flight camera 100 is included in a handheld device (e.g., a mobile phone, a tablet, a camera, etc.) that has size and power constraints determined, at least in part, based on the size of the device. Alternatively, or in addition, time of flight camera 100 may have specific desired device parameters such as frame rate, depth resolution, lateral resolution, etc.

Figure 2A:
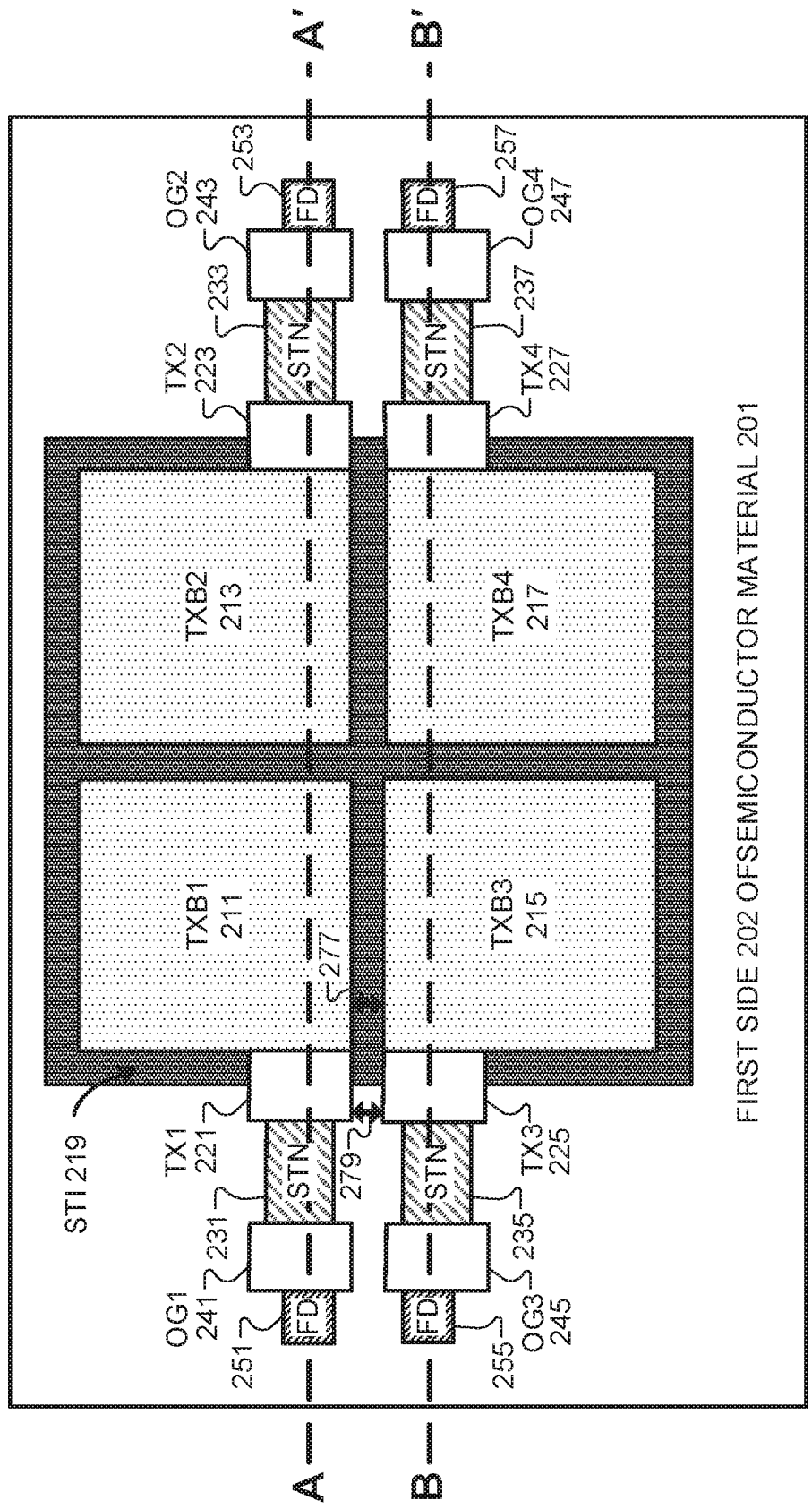
FIG. 2A is a top-down illustration of an example image sensor, which may be included in the time of flight camera of FIG. 1, in accordance with the teachings of the present disclosure.
Figure 2B:
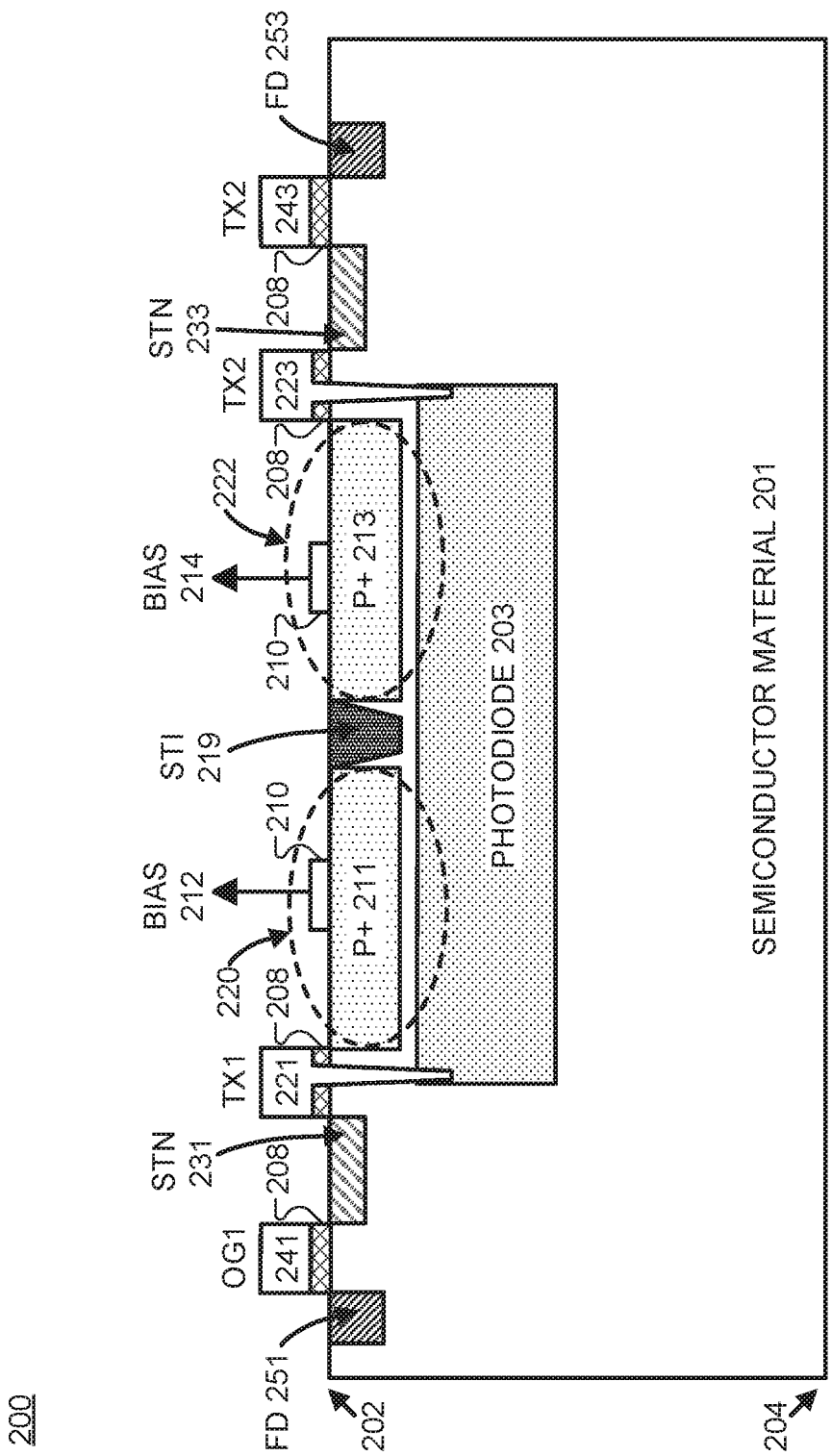
FIG. 2B is a cross-sectional illustration of the image sensor in FIG. 2A as cut along line A-A', in accordance with the teachings of the present disclosure.

FIGS. 2A-2B are top-down and cross-sectional illustrations of an example image sensor 200 with boosted photodiodes for time of flight measurements, in accordance with the teachings of the present disclosure. Image sensor 200 is one possible implementation of the image sensor 120 included in time of flight camera 100 of FIG. 1. As will be shown in FIGS. 2A-2B, image sensor 200 includes semiconductor material 201, photodiode 203, dielectric layer 208, metal contact 210, first doped region 211, second doped region 213, third doped region 215, fourth doped region 217, first junction capacitor 220, second junction capacitor 222, shallow trench isolation (STI) structure 219, first vertical transfer gate 221, second vertical transfer gate 223, third vertical transfer gate 225, fourth vertical transfer gate 227, first storage node 231, second storage node 233, third storage node 235, fourth storage node 237, first output gate 241, second output gate 243, third output gate 235, fourth output gate 247, first floating diffusion 251, second floating diffusion 253, third floating diffusion 255, and fourth floating diffusion 257.

In the various embodiments, a variety of materials and fabrication techniques may be utilized to form the image sensor 200. The semiconductor material 201 may have a composition of Si (e.g., single crystal or polycrystalline Si). The photodiode 203, the first doped region 211, the second doped region 213, the third doped region 215, the fourth doped region 217, the first storage node 231, the second storage node 233, the third storage node 235, the fourth storage node 237, first floating diffusion 251, second floating diffusion 253, third floating diffusion 255, and fourth floating diffusion 257 may be formed by doping or implanting various dopants or constituents (e.g., B, Al, N, Ga, In, P, As, Sb, Ge, and the like) within specific regions of the semiconductor material 201. The dielectric layer 208 and the shallow trench isolation structure 219 may be formed from $SiO_2$, $HfO_2$, $Si_3N_4$, and any other suitable dielectric or insulating material that meets the specific insulating requirements of the image sensor 200. Metal contact 210 may be formed from Ti, a TiNi alloy, or any other metal that does not form a silicide with Si. The first vertical transfer gate 221, second vertical transfer gate 223, third vertical transfer gate 225, fourth vertical transfer gate 227, first output gate 241, second output gate 243, third output gate 235, and fourth output gate 247 may be formed of various metals (e.g., Au, Cu, Ni, Ti), metal alloy, polycrystalline silicon, and any other suitable material as known by one of ordinary skill in the art. Other metals, semiconductors, and insulating materials may also be utilized for image sensor 200, as known by one of ordinary skill in the art. Doped regions of the semiconductor material 201 may be formed by diffusion, implantation, and the like. Fabrication techniques such as photolithography, chemical etching, ion implantation, thermal evaporation, chemical vapor deposition, sputtering, and the like, as known by one of ordinary skill in the art, may be utilized to fabricate the image sensor 200.

FIG. 2A is a top-down illustration of an example image sensor 200, which may be included in the time of flight camera 100 of FIG. 1, in accordance with the teachings of the present disclosure. The illustrated embodiment presents a top-down illustration of a first side 202 of the semiconductor material 201. The first doped region 211, the second doped region 213, the third doped region 215, and the fourth doped region 217 of the semiconductor material 201 are positioned proximate to the first side 202 of the semiconductor material 201 and arranged in a two-by-two matrix between the first vertical transfer gate 221, the second vertical transfer gate 223, the third vertical transfer gate 225, and the fourth vertical transfer gate 227. The doped regions (211, 213, 215, and 217) are arranged directly on top of the photodiode 203 (not illustrated) to couple the junction capacitance of a particular one of the doped regions (211, 213, 215, and 217) to a corresponding portion of the photodiode 203. The STI structure 219 is disposed between and at least partially surrounds the doped regions (211, 213, 215, and 217). A first distance 277 between the first doped region 211 and the third doped region 215 is substantially equal to a second distance 279 between the first vertical transfer gate 221 and the third vertical transfer gate 225.

In the illustrated embodiment, the first doped region 211 and the second doped region 213 are positioned between the first vertical transfer gate 221 and the second vertical transfer gate 223. More specifically, the first doped region 211 is positioned between the first storage node 231 and the second doped region 213. The second doped region 213 is positioned between the second storage node 233 and the first doped region 211. Similarly, the third doped region 215 and the second doped region 217 are positioned between the third vertical transfer gate 225 and the fourth vertical transfer gate 227. More specifically, the third doped region 215 is positioned between the fourth doped region 217 and the third storage node 235. The fourth doped region 217 is positioned between the fourth storage node 237 and the third doped region 215.

As illustrated in FIG. 2A, the first vertical transfer gate 221, the second vertical transfer gate 223, the first doped region 211, the second doped region 213, the first storage node 231, and the second storage node 233 are oriented laterally proximate to the first side 202 of the semiconductor material 201 along a first direction A-A' of the image sensor 200. Additionally, the first output gate 241, the second output gate 243, the first floating diffusion 251, and the second floating diffusion 253 may also be oriented laterally proximate to the first side 202 of the semiconductor material 201 along the first direction A-A'. Similarly, the third vertical transfer gate 225, the fourth vertical transfer gate 227, the third doped region 215, the fourth doped region 217, the third storage node 235, and the fourth storage node 237 are oriented laterally proximate to the first side 202 of the semiconductor material 201 along a second direction B-B'. The third output gate 245, the fourth output gate 247, the third floating diffusion 255, and the fourth floating diffusion 257 may also be oriented laterally proximate to the first side 202 of the semiconductor material 201 along the second direction B-B'. In some embodiments, the first direction A-A' is substantially parallel to the second direction B-B'. In the same or other embodiments, the image sensor 200 may be substantially identical across a midpoint between the first doped region 211 and the third doped region 215 along a direction substantially parallel to the first direction A-A' and the second direction B-B'.

FIG. 2B is a cross-sectional illustration of the image sensor 200 in FIG. 2A as cut along line A-A', in accordance with the teachings of the present disclosure. Image sensor 200 includes the photodiode 203 disposed in the semiconductor material 201. The first doped region 211 and second doped region 213 are disposed in the semiconductor material 201 between the first side 202 of the semiconductor material 201 and the photodiode 203. The first storage node 231 and the second storage node 233 are disposed in the semiconductor material 201 with the first doped region 211 positioned between the first storage node 231 and the second doped region 213. The second doped region 213 is positioned between the second storage node 233 and the first doped region 211. The first vertical transfer gate 221 is coupled between the photodiode 203 and the first storage node 231. The second vertical transfer gate 223 is coupled between the photodiode 203 and the second storage node 233. In some embodiments, the vertical transfer gates (e.g., 221, 223, 225, and 227) are coated in a dielectric or insulting material to provide a gate oxide between the photodiode 203 and the corresponding vertical transfer gate (e.g., 221, 223, 225, and 227).

As illustrated in FIG. 2B, the first doped region 211 and the second doped region 213 are positioned between the first vertical transfer gate 221 and the second vertical transfer gate 223. The photodiode 203 extends from the first vertical transfer gate 221 to the second vertical transfer gate 223 such that the photodiode is positioned vertically adjacent to the first doped region 211 and the second doped region 213. The STI structure 219 is disposed between the first doped region 211, the second doped region 213, and the photodiode 203. In one embodiment, the STI structure 219 may further be disposed between vertical transfer gates (e.g., 221 and 223) and a corresponding doped region (e.g., 211 and 213) of the semiconductor material 201. The first doped region 211 is included in the first junction capacitor 220, which is coupled to a first portion of the photodiode 203. Similarly, the second doped region 213 is included in the second junction capacitor 222, which is coupled to a second portion of the photodiode 203. The first junction capacitor 220 and the second junction capacitor 222 are p-n junctions having a respective first junction capacitance and second junction capacitance when reverse biased (e.g., bias 212 and bias 214) via the metal contacts 210. As illustrated the doped regions (e.g., 211 and 213) have a P+ doping profile. In one embodiment, the n-component of the junction capacitors may be disposed between the photodiode 203 and the doped regions. In other embodiments, the n-component of the junction capacitors may be part of the photodiode 203. For example, the photodiode 203 may be a partially pinned photodiode with n-doped and p-doped layers of the semiconductor material 201. In other embodiments, the doped regions (e.g., 211, 213, 215, and 217) may have an N+ doping profile. It is appreciated that other doping profiles may be utilized that the doping profile expressly described herein to form the p-n junction of the junction capacitors.

The image sensor 200 utilizes both vertical and horizontal electric fields to increase the diffusion of charge carriers (e.g., signal electrons) from the photodiode 203 to the storage node (e.g., 231, 233, 235, and 237) to facilitate improved time of flight measurements. The photodiode 203 converts image light to an electric signal (e.g., charge carriers, signal electrons, and the like) in response to the image sensor 203 being illuminated by the image light. The signal electrons are then quickly transferred from the photodiode 203 to the storage node (e.g., 231, 233, 235, and 237). For example, the first vertical transfer gate 221 is coupled between the photodiode 203 and the first storage node 231 to transfer the electric signal from the photodiode 203 to the first storage node 231 in response to a first transfer signal. Similarly, the second vertical transfer gate 223 is coupled between the photodiode 203 and the second storage node 233 to transfer the electric signal from the photodiode 203 to the second storage node 233 in response to a second transfer signal. The first and second transfer signals create a corresponding electric field to facilitate the transfer of signal electrons (e.g., the electric signal) from the photodiode 203 vertically towards the corresponding storage node (e.g., 231 and 233, respectively).

To further increase the speed of the transfer of signal electrons from the photodiode 203 to the respective storage nodes (e.g., 231, 233, 235, and 237), the junction capacitors (e.g., 220 and 222) are utilized by reverse biasing the doped regions (e.g., 211, 213, 215, and 217) to generate a first, second, third, and fourth junction capacitance, respectively. The biasing of the doped regions may be applied at different times to generate horizontal electric fields across the photodiode to further increase the drift velocity of the signal electrons (e.g., the electric signal) in the horizontal direction (e.g., the direction parallel to the first side 202 of the semiconductor material 201). For example, reverse biasing both the first doped region 211 and the second doped region 213 will facilitate transferring signal electrons from within the photodiode 203 closer to the interface between the photodiode 203 and the corresponding doped region 211 and 213. Then, a horizontal electric field may be formed by removing the bias 212 (214) on the first doped region 211 (second doped region 213) while still applying the bias 214 (212) to the second doped region 213 (first doped region 211) to increase drift velocity of the signal electrons toward the second storage node 233 (first storage node 231). Biasing one doped region and not the other creates a potential difference between doped regions, which in turn forms the horizontal electric field that increases signal electron drift velocity. While this technique for forming the horizontal electric field is described in relation to the two doped regions 211 and 213, it is appreciate that other embodiments may utilize more than two doped regions (e.g., the first doped region 211, the second doped region 213, the third doped region 215, and the fourth doped region 216 may all be utilized to form the horizontal electric field). Similarly, the number of doped regions and/or junction capacitors utilized should not be deemed limiting and that any number may be utilized depending on the particular configuration of the image sensor 200.

In the illustrated embodiment of FIG. 2B, once the signal electrons are transferred to a respective one of the storage nodes (e.g., the first storage node 231 and the second storage node 233), the signal electrons may then again be transferred to a corresponding floating diffusion (e.g., the first floating diffusion 251 and the second floating diffusion 253) via a respective output transfer gate (e.g., the first output transfer gate 241 and the second output transfer gate 243) in response to a respective first output signal or second output signal. The floating diffusion 251 and 253 may correspond to readout nodes of the image sensor 200. The signal electrons may then be transferred to other readout circuitry or logic for further processing, in accordance with the teachings of the present disclosure.

Figure 3A:
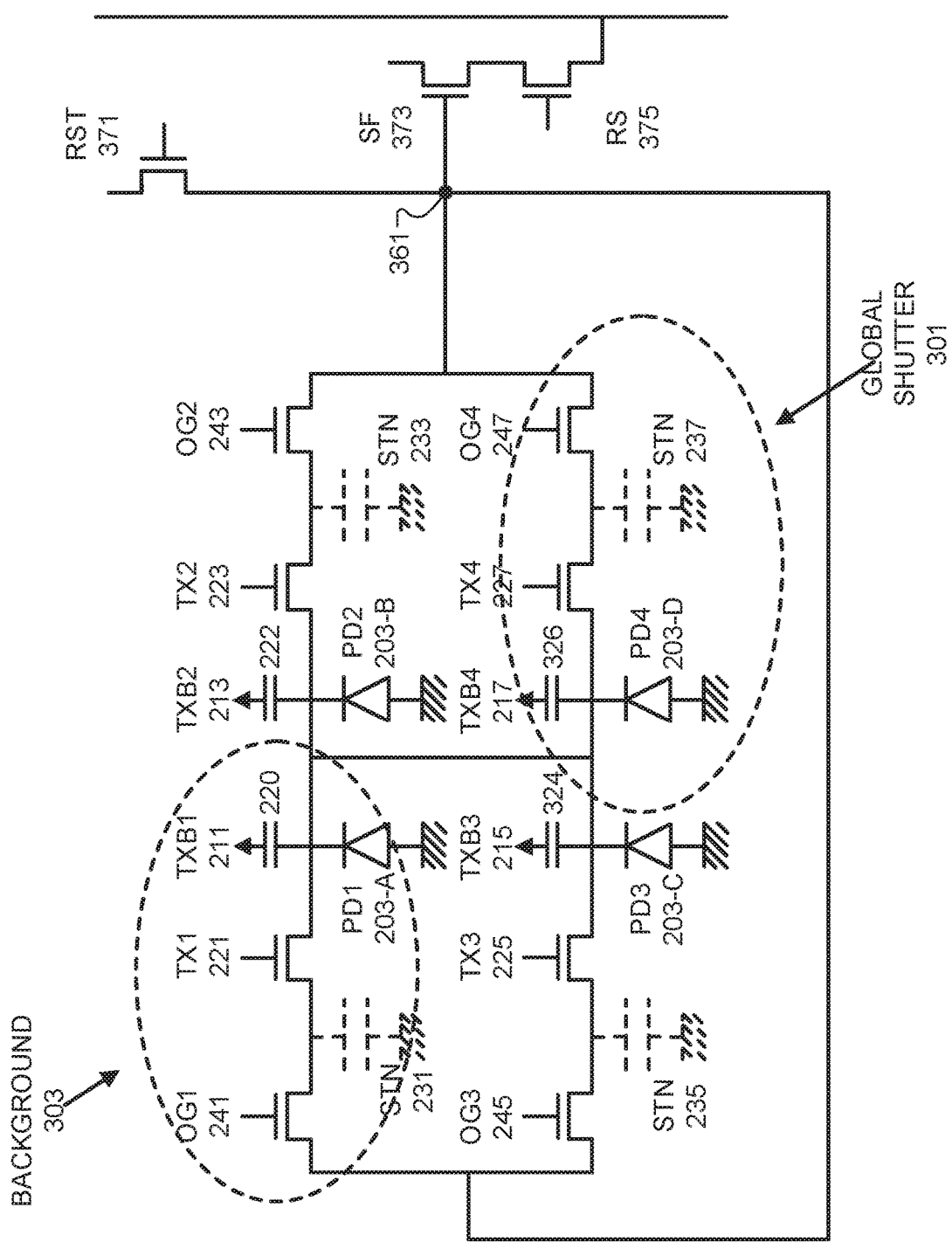
FIG. 3A shows a pixel circuit diagram including one source-follower circuit, which may include the image sensor of FIG. 2A, in accordance with the teachings of the present disclosure.

FIG. 3A shows a pixel circuit diagram 300 including one source-follower circuit, which may include the image sensor 200 of FIG. 2A, in accordance with the teachings of the present disclosure. The pixel circuit diagram 300 is one possible implementation of a time of flight imaging system, which includes the image sensor 200 of FIG. 2A. Referring back to FIG. 3A, the pixel circuit diagram 300 includes the photodiode 203, different portions of which, correspond to PD1 203-A, PD2 203-B, PD3 203-C, and PD4 203-D. These portions of the photodiode 203 correspond to the region of the photodiode 203 proximate to the doped regions (e.g., 211, 213, 215, and 217 of FIG. 2A). The doped regions may be biased, as illustrated, and have a junction capacitor (e.g., the first junction capacitor 220, the second junction capacitor 222, a third junction capacitor 324, and a fourth junction capacitor 326) coupled to a respective portion of the photodiode 203 (e.g., 203-A, 203-B, 203-C, and 203-D). The first transfer gate 221 is coupled between the first junction capacitor 220 and the first storage node 231. The second transfer gate 223 is coupled between the second junction capacitor 222 and the second storage node 233. The first output gate 241 is coupled between the first storage node 231 and a readout node 361 to transfer the electric signal to the readout node 361 in response to a first output signal. Similarly, the second output gate 243 is coupled between the second storage node 233 and the readout node 361 to transfer the electric signal to the readout node 361 in response to a second output signal.

In the illustrated embodiment, the pixel circuit diagram 300 also includes a source-follower circuit for readout of the signal electrons from the photodiode 203. The source-follower circuit includes a reset gate 371, a source-follower gate 373, and a row select gate 375. Advantages of the pixel circuit diagram 300 include a smaller number of devices and simple readout timing. A first portion of the pixel circuit diagram 300 may be utilized to respond to a global shutter 301 signal which initializes or presets the pixel circuit 300 to an initialization state. A second portion of the pixel circuit diagram 300 may be utilized to acquire a background signal 302 that corresponds to the background noise of the image sensor before a pulse of light is emitted for time of flight measurements.

Figure 3B:
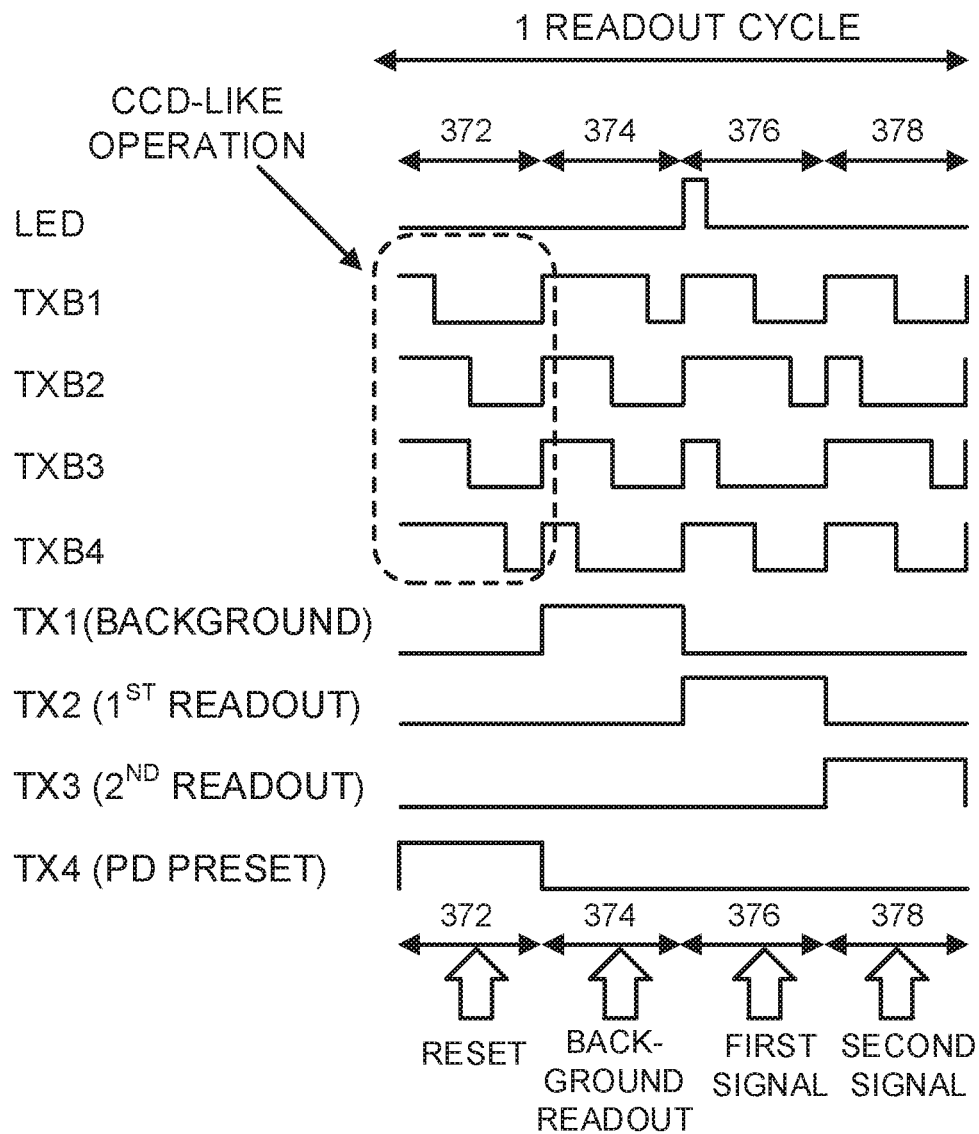
FIG. 3B is a timing diagram for a readout cycle of the pixel circuit included in FIG. 3A, in accordance with the teachings of the present disclosure.

FIG. 3B is a timing diagram 350 for a readout cycle of the pixel circuit included 300 in FIG. 3A, in accordance with the teachings of the present disclosure. More specifically, the timing diagram 350 is readout timing from the photodiode (e.g., the photodiode 203 of FIG. 3A) to the storage node (e.g., the first storage node 231, the second storage node 233, the third storage node 235, and the fourth storage node 237 of FIG. 3A). Each row of the timing diagram 350 corresponds to a logic high or low (e.g. on or off, 1 or 0, and the like). The LED row corresponds to when a light source is activated (e.g., the pulse 106 of the emitted light 104 of the light source 102 as illustrated in FIG. 1). The row for TXB1, TXB2, TXB3, and TXB4 each respectively correspond to a bias applied to the doped region (e.g., the first doped region 211, the second doped region 213, the third doped region 215, and the fourth doped region 216 of FIG. 2A). The row for TX1, TX2, TX3, and TX4 each respectively correspond to a transfer signal (e.g., a first transfer signal applied to the first vertical transfer gate 221, a second transfer signal applied to the second vertical transfer gate 223, a third transfer signal applied to the third vertical transfer gate 225, and a fourth transfer signal applied to the fourth vertical transfer gate 227 of FIG. 2A).

As illustrated in FIG. 3B, during a first time period 372 the photodiode is reset to an initialization state and during a second time period 374 a background signal is readout. During a third time period 376 a first signal of the photodiode is readout, and during a fourth time period a second signal of the photodiode is readout. Transfer of the signal electrons from the photodiode to the storage node for a single readout cycle consumes several steps. This involves selectively applying a bias to the first doped region TXB1 (e.g., TXB1 211 of FIG. 3A) of the first junction capacitor (e.g., the junction capacitor 220 of FIG. 3A), the second doped region TXB2 (e.g., TXB2 213 of FIG. 3A) of the second junction capacitor (e.g., the junction capacitor 222 of FIG. 3A), the third doped region TXB3 (e.g., TXB3 215 of FIG. 3A) of the third junction capacitor (e.g., the junction capacitor 324 of FIG. 3A), and the fourth doped region TXB4 (e.g., TXB4 217 of FIG. 3A) of the fourth junction capacitor (e.g., the junction capacitor 326 of FIG. 3A) to couple the junction capacitance of each of the first junction capacitor, the second junction capacitor, the third junction capacitor, and the fourth junction capacitor to the photodiode (e.g., PD1 203-A, PD2 203-B, PD3 203-C, and PD4 203-D of FIG. 3A). This process further includes selectively enabling the first vertical transfer gate TX1 (e.g., TX1 221 of FIG. 3A), the second vertical transfer gate TX2 (e.g., TX2 223 of FIG. 3A), the third vertical transfer gate TX3 (e.g., TX3 225 of FIG. 3A), and the fourth vertical transfer gate TX4 (e.g., TX4 227 of FIG. 3A) to transfer the electric signal generated by the photodiode in response to incident image light to a respective one of the first storage node (e.g., storage node 231 of FIG. 3A), the second storage node (e.g., storage node 233 of FIG. 3A), the third storage node (e.g., storage node 235 of FIG. 3A), and the fourth storage node (e.g., storage node 237 of FIG. 3A). The junction capacitance provides an electric field to drive the electric signal from the photodiode to the respective one of the first storage node, the second storage node, the third storage node, and the fourth storage node.

More specifically, during the first time period 372, the fourth vertical transfer gate TX4 is enabled while the first vertical transfer gate TX1, the second vertical transfer gate TX2, and the third vertical transfer gate TX3 are disabled to preset the photodiode to an initialization state (e.g., perform a reset of the circuit). A bias is then applied to the first doped region TXB1, the second doped region TXB2, the third doped region TXB3, and the fourth doped region TXB4 during the first time period. The bias is then removed in the order of the first doped region TXB1, followed by simultaneously removing from bias from the second doped region TXB2 and the third doped region TXB3, and then removing the bias from the fourth doped region TXB4 to direct signal electrons to the fourth storage node (e.g., storage node 237 of FIG. 3A) via the fourth vertical transfer gate TX4.

During the second time period 374, the first vertical transfer gate TX1 is enabled while the second vertical transfer gate TX2, the third vertical transfer gate TX3, and the fourth vertical transfer gate TX4 are disabled to acquire a background signal (e.g., readout). At the same time a bias is applied to the first doped region TXB1, the second doped region TXB2, the third doped region TXB3, and the fourth doped region TXB4. The bias is then removed in the order of the fourth doped region TXB4, followed by simultaneously removing the bias from the second doped region TXB2 and the third doped region TXB3, and then removing the bias from the first doped region TXB1 during the second time period 374 to direct signal electrons (e.g., representing a background signal) to the first storage node (e.g., storage node 231 of FIG. 3A) via the first vertical transfer gate TX1.

During the third time period 376, the pulse of light LED for time of flight measurements is emitted and a first signal is acquired/readout. At initial emission of the pulse of light LED, the second vertical transfer gate TX2 is enabled while the first vertical transfer gate TX1, the third vertical transfer gate TX3, and the fourth vertical transfer gate TX4 are disabled to readout the first signal of the image sensor. At the same time, a bias is applied to the first doped region TXB1, the second doped region TXB2, the third doped region TXB3, and the fourth doped region TXB4. The bias is then removed in the order of the third doped region TXB3, followed by simultaneously removing the bias from the first dope region TXB1 and the fourth doped region TXB4, followed by removing the bias from the second doped region TXB2 during the third time period 376 to direct signal electrons (e.g., representing the first signal) to the second storage node (e.g., storage node 233 of FIG. 3A) via the second vertical transfer gate TX2.

During the fourth time period 378, the third vertical transfer gate TX3 is enabled while the first vertical transfer gate TX1, the second vertical transfer gate TX2, and the fourth vertical transfer gate TX4 are disabled to acquire a second signal (e.g., readout) of the image sensor. At the same time, a bias is applied to the first doped region TXB1, the second doped region TXB2, the third doped region TXB3, and the fourth doped region TXB4. The bias is then removed in the order of the second doped region TXB2, followed by simultaneously removing the bias from the first doped region TXB1 and the fourth doped region TXB4, and then following by removing the bias from the third doped region TXB3 to direct signal electrons (e.g., representing the second signal) to the third storage node (e.g., storage node 235 of FIG. 3A) via the third vertical transfer gate TX3.

Figure 3C:
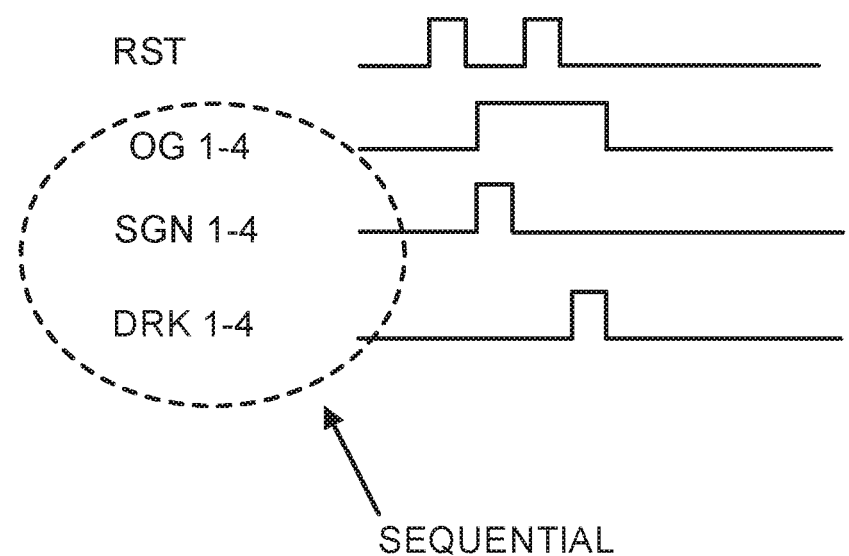
FIG. 3C is a timing diagram for signal readout of the pixel circuit included in FIG. 3A, in accordance with the teachings of the present disclosure.

FIG. 3C is a timing diagram 380 for signal readout of the pixel circuit 300 included in FIG. 3A, in accordance with the teachings of the present disclosure. FIG. 3C is one possible implementation of row by row readout for the pixel circuit 300. In the illustrated embodiment, row by row readout is implemented using correlated double sampling in which two readouts per photodiode portion are obtained. As illustrated, when the output transfer gate is initially enabled, signal is readout (e.g., as SGN 1-4) from the storage nodes (e.g., storage nodes 241, 243, 245, and 247 of FIG. 3A) for the selected row. Then a reset signal is applied and a dark-current readout is performed. It is noted that readout of OG 1-4, SGN 1-4, and DRK 1-4 is done sequentially. In other words, each of the photodiode portions are readout at different times.

Figure 4A:
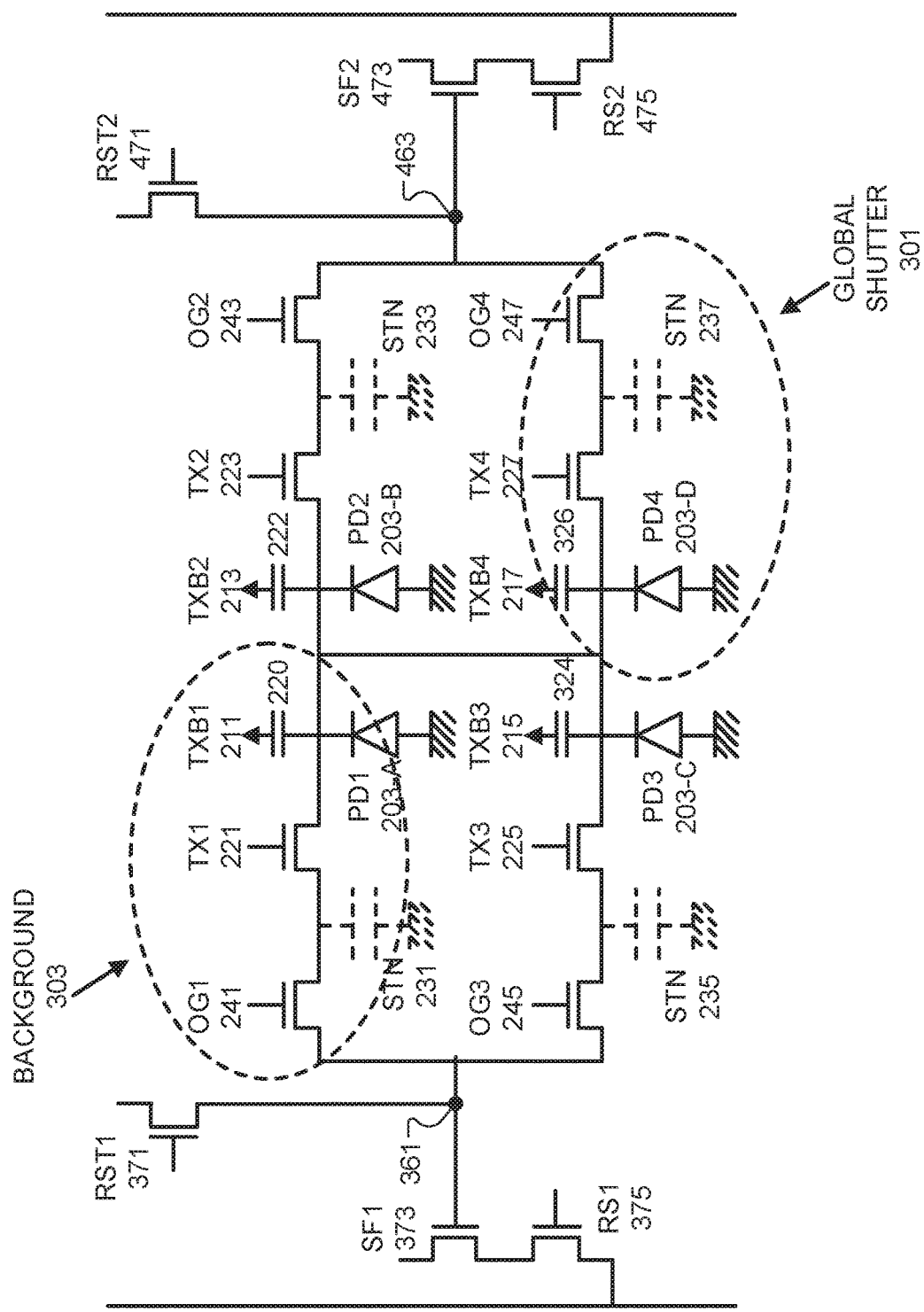
FIG. 4A shows a pixel circuit diagram including two source-follower circuits, which may include the image sensor of FIG. 2A, in accordance with the teachings of the present disclosure.

FIG. 4A shows a pixel circuit diagram 400, including two source-follower circuits SF1 373 and SF2 473, which may be included with the image sensor 200 of FIG. 2A, in accordance with the teachings of the present disclosure. The pixel circuit diagram 400 is similar to the pixel circuit diagram 300 in many regards. As illustrated in FIG. 4A, one difference is that pixel circuit diagram 400 includes two source-follower circuits SF1 373 and SF2 473 rather than a single source-follower circuit SF1 373 illustrated in FIG. 2A. The addition of a second source-follower circuit SF2 473 of FIG. 4A may provide faster signal readout and improved dark current due to the faster readout. As illustrated in FIG. 4A, the pixel circuit 400 includes the first readout node 361 coupled to OG1 241 and OG3 245 and a second readout node 463 coupled to OG2 243 and OG4 247. More specifically, the first output transfer gate 241 (e.g., transistor) is coupled to the first storage node 231 to transfer the electric signal (e.g., signal electrons) to the first readout node 361. The second output gate 243 (e.g., transistor) is coupled to the second storage node 233 to transfer the electric signal to the second readout node 463. It is noted that the first readout node 361 and the second readout node 463 are distinct and separate readout nodes of the pixel circuit 400. This is done, at least in part, by having the first readout node 361 coupled between the first output gate 241 and the first source-follower circuit. Similarly, the second readout node 463 is coupled between the second output gate 243 and the second source-follower circuit.

Figure 4B:
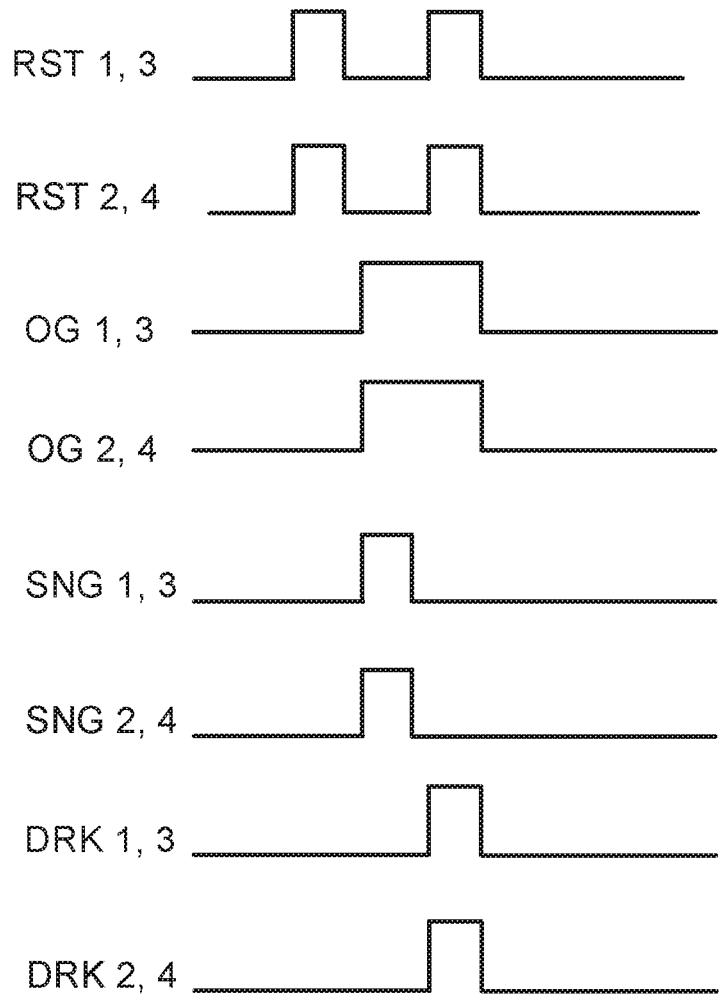
FIG. 4B is a timing diagram for signal readout of the pixel circuit included in FIG. 4A, in accordance with the teachings of the present disclosure.

FIG. 4B is a timing diagram 480 for signal readout of the pixel circuit 400 included in FIG. 4A, in accordance with the teachings of the present disclosure. FIG. 4B is one possible implementation of row by row readout for the pixel circuit 400. Timing diagram 480 is similar to the timing diagram 380 of FIG. 3C in many regards. One difference is that simultaneous readout for certain elements may occur thanks to the addition of the source-follower circuit of pixel circuit 400 in FIG. 4A. Thus readout of OG1 (OG3), OG2 (OG4), SNG1 (SNG3), SNG2 (SNG4) may occur simultaneously. Similarly, readout of DRK1 (DRK3) and DRK2 (DRK4) while OG1 (OG3) and OG2 (OG4) are enabled may also occur simultaneously. The reset operation is also done faster by enabling RST1 (RST3) and RST2 (RST4) at the same time.

Figure 5A:
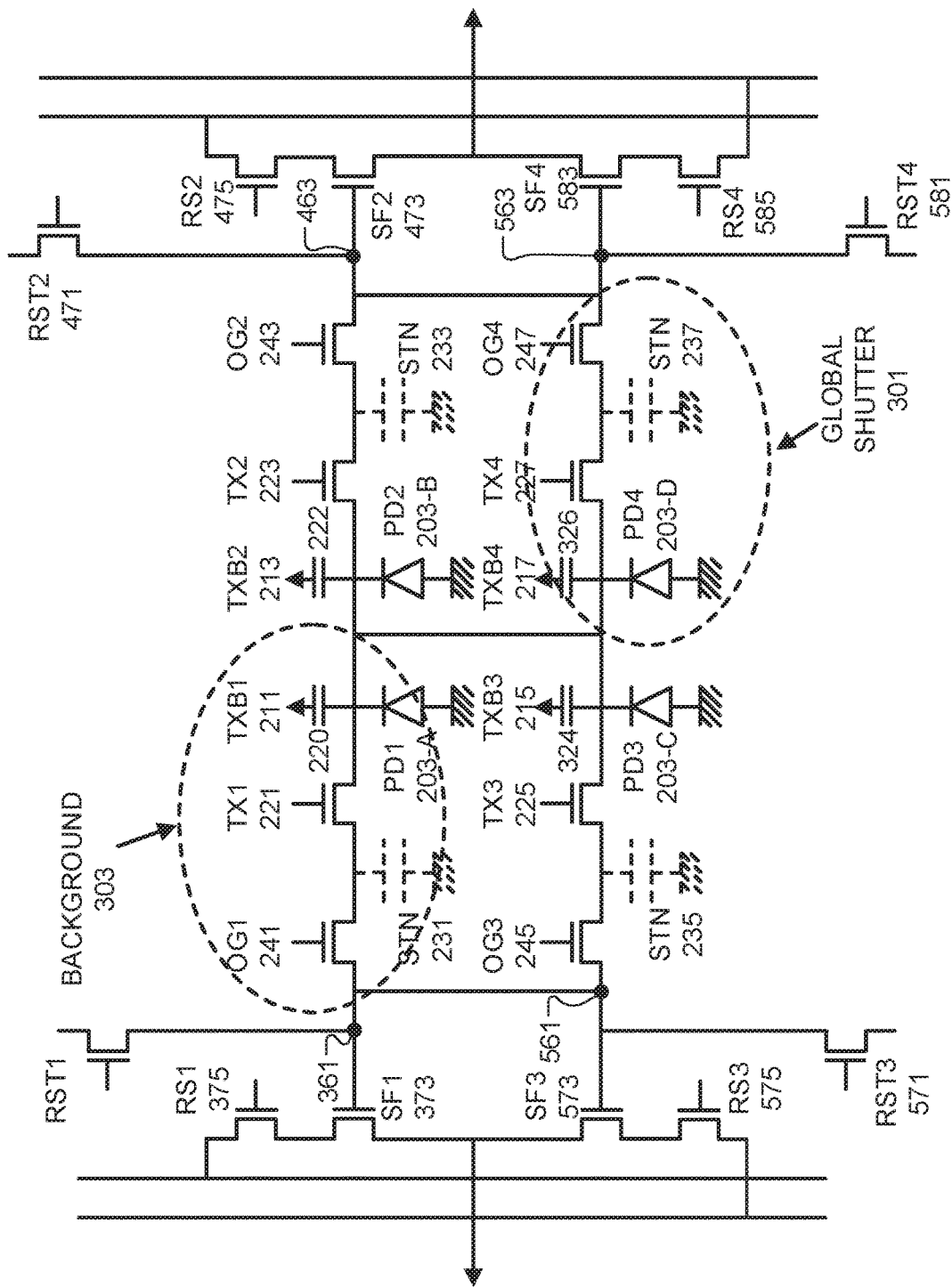
FIG. 5A shows a pixel circuit diagram including four source-follower circuits, which may include the image sensor of FIG. 2A, in accordance with the teachings of the present disclosure.

FIG. 5A shows a pixel circuit diagram 500, including four source-follower circuits SF1 373, SF2 473, SF3 573 and SF4 583, and which may also include the image sensor 200 of FIG. 2A, in accordance with the teachings of the present disclosure. The pixel circuit diagram 500 is similar to the pixel circuit diagram 300 of FIG. 3A and pixel circuit diagram 400 of FIG. 4A. As illustrated in FIG. 5A, one difference is that pixel circuit diagram 500 includes four source-follower circuits SF1 373, SF2 473, SF3 573 and SF4 583, each respectively coupled to a corresponding portion of the photodiode (e.g., PD1 203-A, PD2 203-B, PD3 203-C, and PD4 203-D). The inclusion of the four source-follower circuits SF1 373, SF2 473, SF3 573 and SF4 583 allows for faster readout and improved dark current due to the faster readout. As illustrated, the first output gate 241 is coupled between the first storage node 231 and the first readout node 361 to transfer the electric signal to the first readout node 361 in response to the first output signal. The second output gate 243 is coupled between the second storage node 233 and the second readout node 463 to transfer the electric signal to the second readout node 463 in response to the second output signal. The third output gate 245 is coupled between the third storage node 235 and the third readout node 561 to transfer the electric signal to the third readout node 561 in response to a third output signal. The fourth output gate 247 is coupled between the fourth storage node 237 and the fourth readout node 563 to transfer the electric signal to the fourth readout node 563 in response to a fourth output signal. For each of the readout nodes (e.g., 361, 463, 561, and 563), the electric signal corresponds to the signal electrons transferred from the respective portion of the photodiode.

FIG. 5B is a timing diagram 580 for signal readout of the pixel circuit 500 included in FIG. 5A, in accordance with the teachings of the present disclosure. FIG. 5B is one possible implementation of row by row readout for the pixel circuit 500. Timing diagram 580 is similar to the timing diagram 480 of FIG. 4B and the timing diagram 380 of FIG. 3C in many regards. One difference is that simultaneous readout for each of the RST 1-4, OG 1-4, SGN1-4, and DRK 1-4 may occur simultaneously. For example, the reset operation is done faster by enabling RST 1-4 at the same time. Similarly, the enabling the output transistors OG1-OG4 and reading out SGN1-SGN4 may occur simultaneously. Dark-current readout (DRK1-4) of each of the nodes is also performed simultaneously.

Figure 6A:
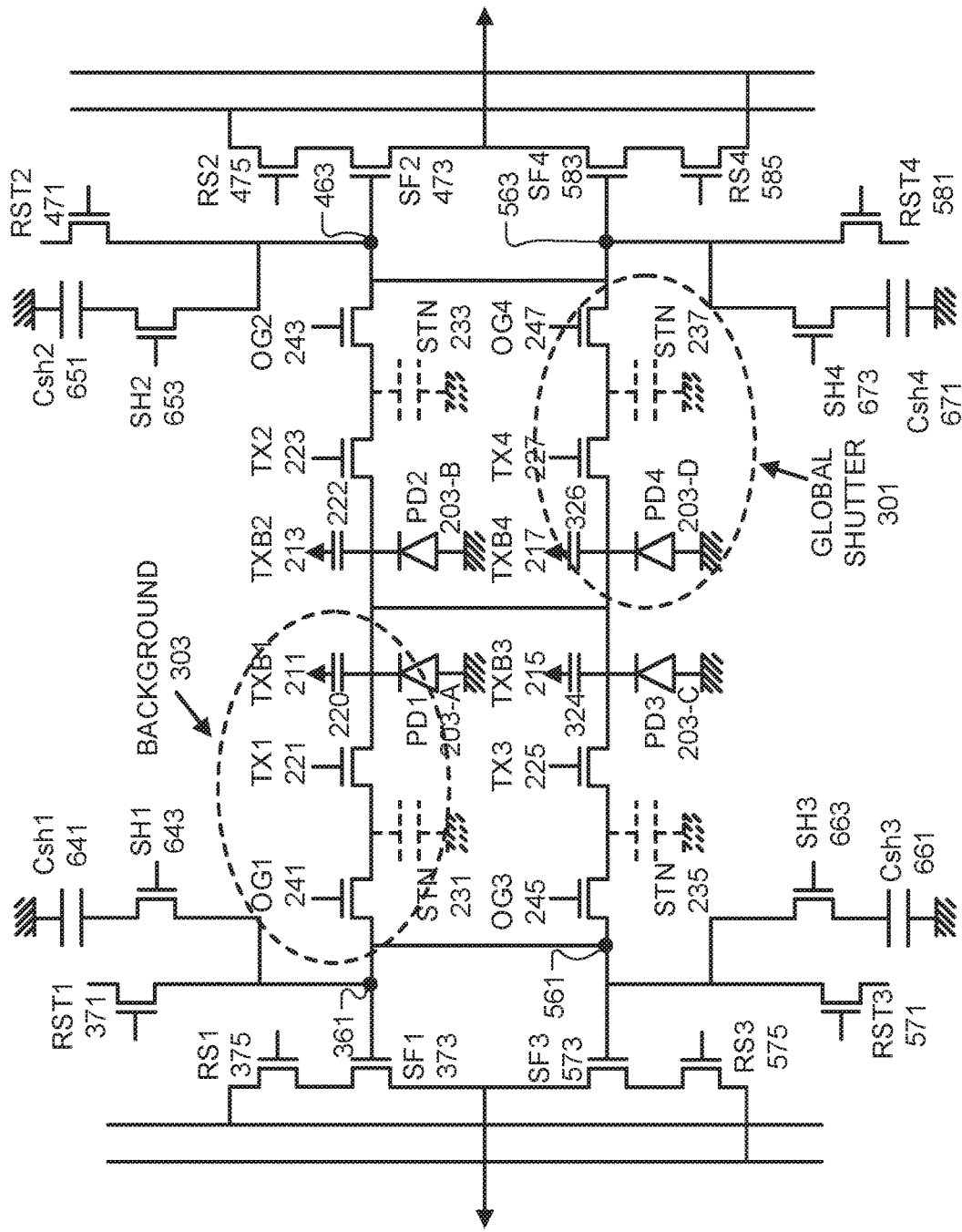
FIG. 6A shows a pixel circuit including four source-follower circuits having a sample hold circuit, which may include the image sensor of FIG. 2A, in accordance with the teachings of the present disclosure.

FIG. 6A shows a pixel circuit 600, including four source-follower circuits SF1 373, SF2 473, SF3 573 and SF4 583 each coupled to a sample hold circuit SH1 643, SH2 653, SH3 663, and SH4 673, which may be included with the image sensor 200 of FIG. 2A, in accordance with the teachings of the present disclosure. The pixel circuit diagram 600 is similar to the pixel circuit diagram 500 of FIG. 5A in many regards. As illustrated in FIG. 6A, one difference is that the pixel circuit diagram 600 includes four sample-hold circuits coupled between one of the reset gates (e.g., 371, 471, 571, and 581) and a corresponding readout node (e.g., 361, 463, 561, 563). The same-hold circuit includes a sample-hold transfer gate e.g., (SH1 643, SH2 653, SH3 663, and SH4 673) coupled to a sample-hold capacitor (e.g., Csh1 641, Csh2 651, Csh3 661, and Csh4 671). The pixel circuit diagram 600 may advantageously result in faster signal readout, reduced dark current due to the faster readout, and little to no signal noise associated with kTC noise (e.g., thermal noise of the capacitors).

Figure 6B:
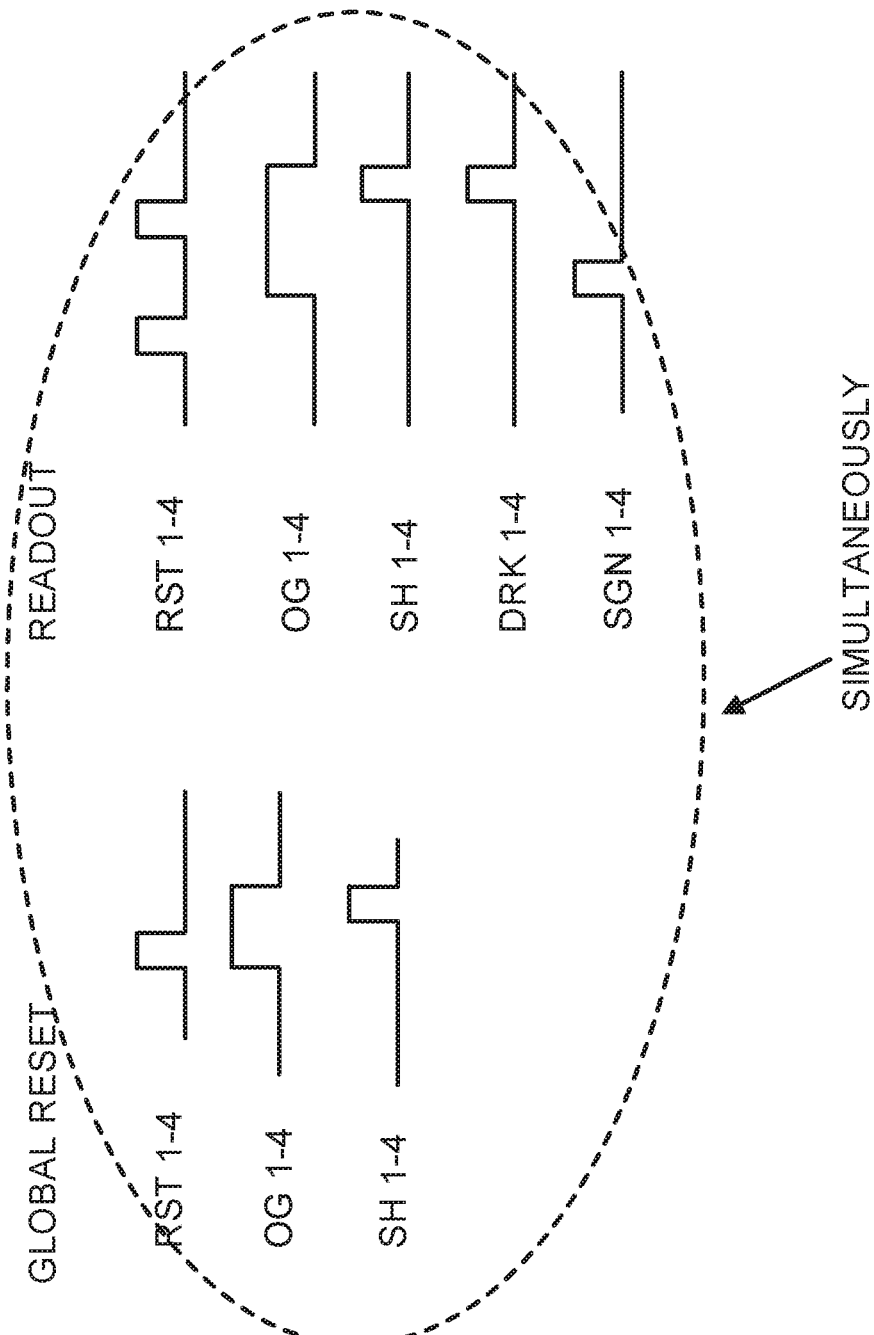
FIG. 6B is a timing diagram for signal readout of the pixel circuit included in FIG. 6A, in accordance with the teachings of the present disclosure.

FIG. 6B is a timing diagram 680 for signal readout of the pixel circuit 600 included in FIG. 6A, in accordance with the teachings of the present disclosure. FIG. 6B is one possible implementation of row by row readout for the pixel circuit 600. Timing diagram 680 is similar to the timing diagram 580 of FIG. 5B in many regards. One difference is that the sample hold transfer gate SH1-4 (e.g., 643, 653, 663, 673) is enabled to transfer the signal to the corresponding capacitor Csh1-4 (e.g., 641, 651, 661, 671) while reading the dark-current DRK1-4. Similarly, the global reset now includes resetting the sample-hold capacitor Csh1-4.

Figure 7A:
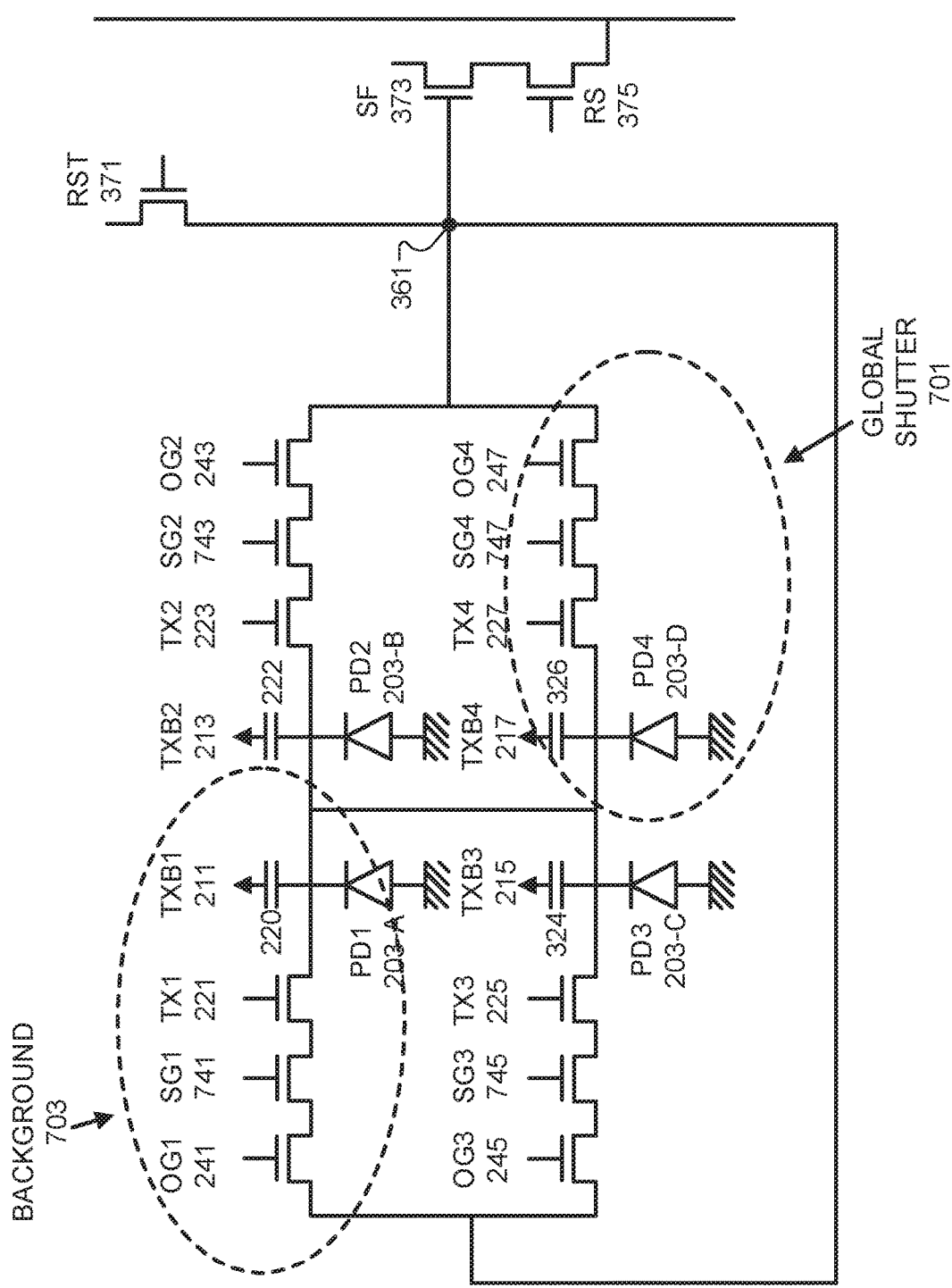
FIG. 7A shows one potential pixel circuit, which may include the image sensor of FIG. 2A, in accordance with the teachings of the present disclosure.

FIG. 7A shows one potential pixel circuit 700, which may include the image sensor 200 of FIG. 2A, in accordance with the teachings of the present disclosure. The pixel circuit diagram 700 is similar to the pixel circuit diagram 300 of FIG. 3A in many regards. One difference is that the pixel circuit diagram 700 includes four storage gates SG1-4 (e.g., 741, 743, 745, and 747). Each of the storage transistors is coupled between a portion of the photodiode (e.g., PD1 203-A, PD2 203-B, PD3 203-C, and PD4 203-D) and a corresponding one of the output transfer gates OG1-4 (e.g., 241, 243, 245, and 247). The use of a storage transistor to temporarily hold the signal electrons may reduce dark current and kTC noise.

Figure 7B:
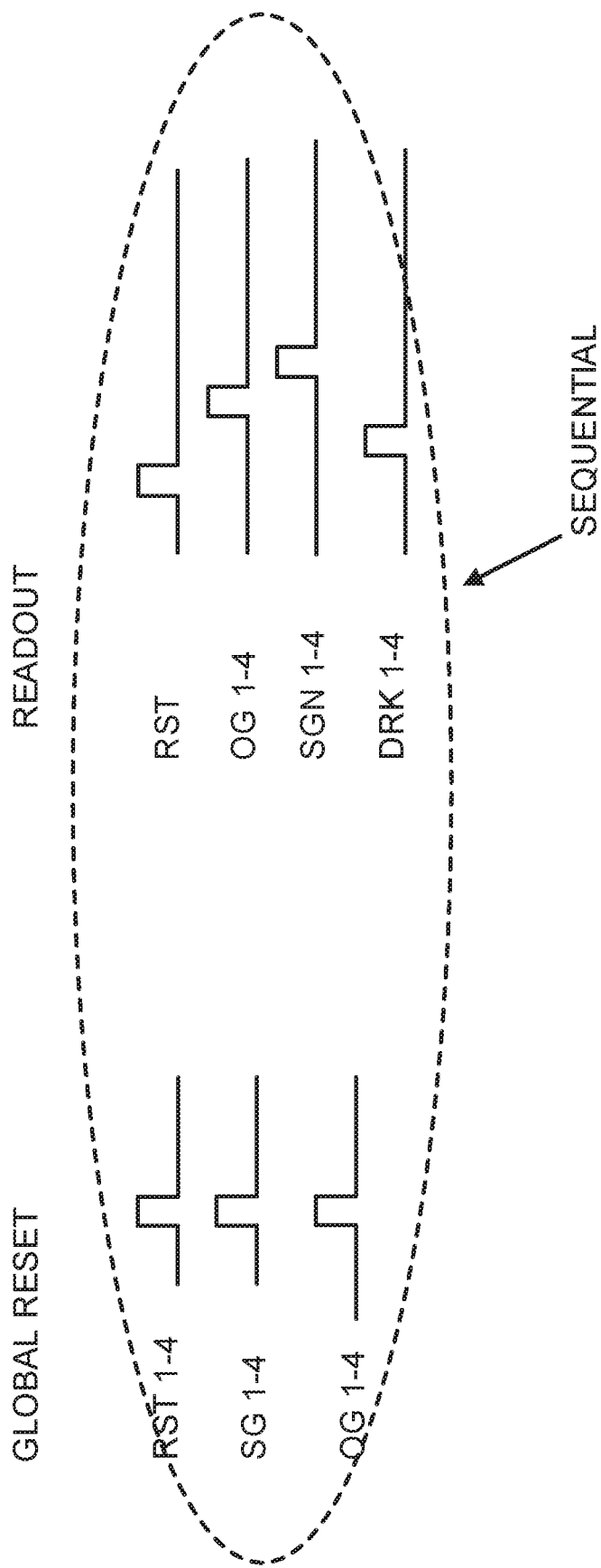
FIG. 7B is a timing diagram for signal readout of the pixel circuit included in FIG. 7A, in accordance with the teachings of the present disclosure.

FIG. 7B is a timing diagram 780 for signal readout of the pixel circuit 700 included in FIG. 7A, in accordance with the teachings of the present disclosure. FIG. 7B is one possible implantation of row by row readout for the pixel circuit 700. Timing diagram 780 is similar to timing diagram 380 in many regards. One difference is dark-current DRK1-4 is readout before the output transfer gate and the transfer signal SGN1-4 is readout. Similarly, the global reset now includes resetting the storage transfer gate SG1-4.

Figure 8:
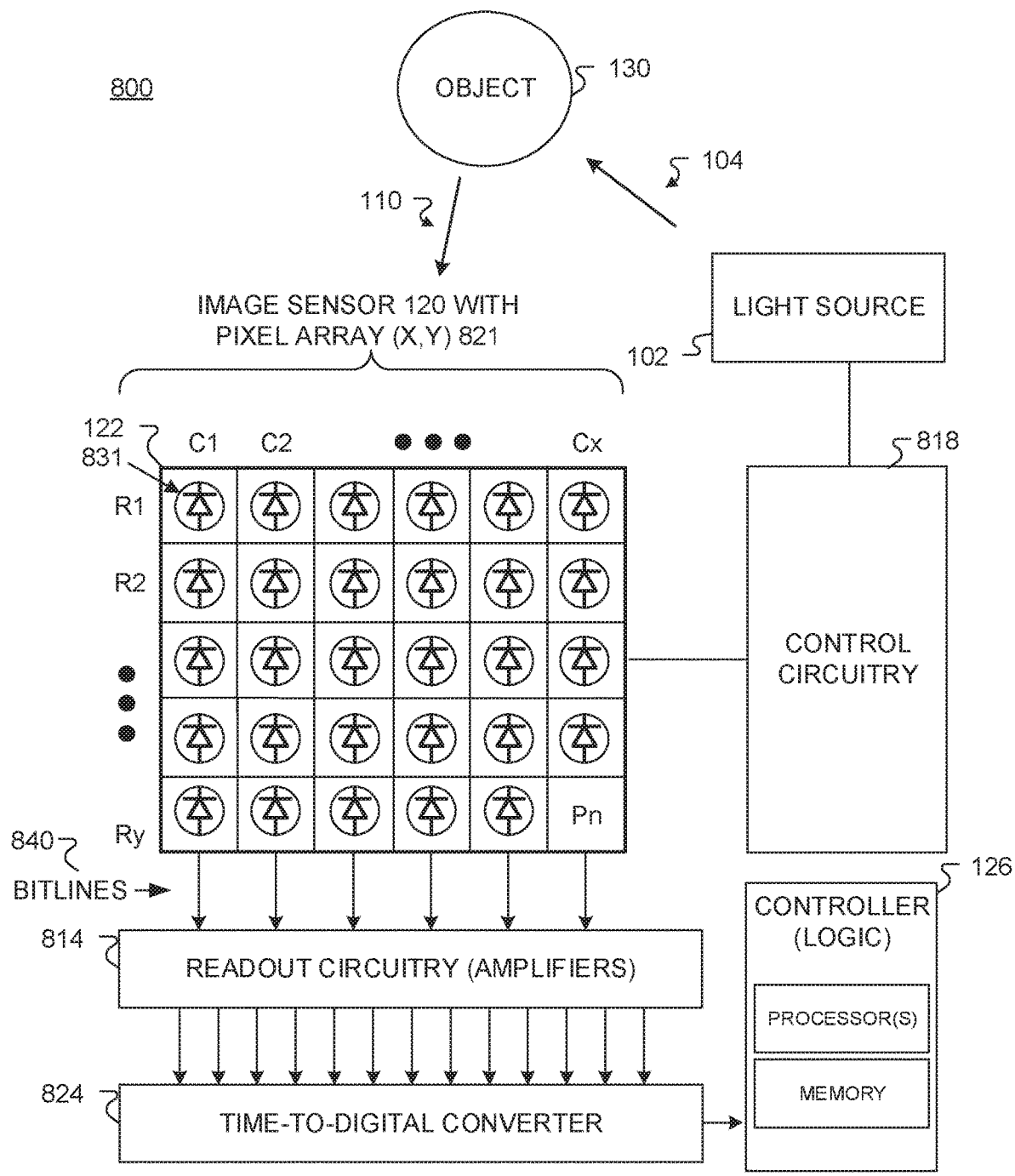
FIG. 8 is a block diagram that shows a portion of an example time of flight imaging system with corresponding readout circuitry, control circuitry, and function logic, in accordance with the teachings of the present disclosure.

FIG. 8 is a block diagram that shows a portion of an example time of flight imaging system 800 with corresponding readout circuitry 814, control circuitry 818, and function logic 126, in accordance with the teachings of the present disclosure. The imaging system 800 includes the image sensor 120 including the first pixel 122 of pixel array 821 with photodetector 831. As illustrated, the imaging system 800 further includes readout circuitry 814, time-to-digital converter(s) 824, control circuitry 818, and controller (e.g., function logic) 126, in accordance with the teachings of the disclosure. It is noted that the imaging system 800 may be implemented in a stacked chip scheme. For instance, as shown in the example, pixel array 821 may be included in a pixel die, while readout circuitry 814, time-to-digital converter(s) 828, and control circuitry 818 may be included in a separate application specific integrated circuit (ASIC) die in accordance with the teachings of the disclosure. In the example, the pixel die and the ASIC die are stacked and coupled together during fabrication to implement a time of flight imaging system in accordance with the teachings of the disclosure. In other embodiments, a non-stacked implementation of the imaging system 800 may be utilized. For example, the pixel die (including the pixel array 821), readout circuitry 814, time-to-digital converter(s) 824, controller 126, and control circuitry 818 may be fabricated on the same Si substrate. In general, it is appreciated that the time of flight imaging system 800 may be implemented in both stacked and non-stacked solutions.

The processes explained above are described in terms of computer software and hardware. The techniques described may constitute machine-executable instructions embodied within a tangible or non-transitory machine (e.g., computer) readable storage medium, that when executed by a machine (e.g., controller 126 of FIG. 1) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of operation for an image sensor, the method comprising:
   selectively applying a bias to a first doped region of a first junction capacitor, a second doped region of a second junction capacitor, a third doped region of a third junction capacitor, and a fourth doped region of a fourth junction capacitor to couple a junction capacitance of each of the first junction capacitor, the second junction capacitor, the third junction capacitor, and the fourth junction capacitor to a photodiode; and
   selectively enabling a first vertical transfer gate, a second vertical transfer gate, a third vertical transfer gate, and a fourth vertical transfer gate to transfer an electric signal generated by the photodiode in response to incident image light to a respective one of a first storage node, a second storage node, a third storage node, and a fourth storage node, wherein the junction capacitance provides an electric field to drive the electric signal from the photodiode to the respective one of the first storage node, the second storage node, the third storage node, and the fourth storage node.

2. The method of claim 1, wherein the first doped region, the second doped region, the third doped region, and the fourth doped region are each laterally surrounded by a shallow trench isolation structure.

3. The method of claim 1, further comprising:
   enabling the fourth vertical transfer gate during a first time period while the first vertical transfer gate, the second vertical transfer gate, and the third vertical transfer gate are disabled to preset the photodiode;
   applying the bias to the first doped region, the second doped region, the third doped region, and the fourth doped region during the first time period; and
   after applying the bias, removing the bias in order of the first doped region, followed by the second and the third doped regions simultaneously, and then followed by the fourth doped region during the first time period.

4. The method of claim 3, further comprising:
   enabling the first vertical transfer gate while the second vertical transfer gate, the third vertical transfer gate, and the fourth vertical transfer gate are disabled during a second time period to readout a background signal;
   applying the bias to the first doped region, the second doped region, the third doped region, and the fourth doped region during the second time period; and
   after applying the bias, removing the bias in order of the fourth doped region, followed by the second and the third doped regions simultaneously, and then followed by the first doped region during the second time period.

5. The method of claim 4, further comprising:
   enabling the second vertical transfer gate while the first vertical transfer gate, the third vertical transfer gate, and the fourth vertical transfer gate are disabled during a third time period to readout a first signal of the image sensor;
   emitting a pulse of light from a light source in response to enabling the second vertical transfer gate during the third time period;
   applying the bias to the first doped region, the second doped region, the third doped region, and the fourth doped region during the third time period; and
   after applying the bias, removing the bias in order of the third doped region, followed by the first and the fourth doped regions simultaneously, and then followed by the second doped region during the third time period.

6. The method of claim 5, further comprising:
   enabling the third vertical transfer gate while the first vertical transfer gate, the second vertical transfer gate, and the fourth vertical transfer gate are disabled during a fourth time period to readout a second signal of the image sensor;
   applying the bias to the first doped region, the second doped region, the third doped region, and the fourth doped region during the fourth time period; and
   after applying the bias, removing the bias in order of the second doped region, followed by the first and the fourth doped regions simultaneously, and then followed by third doped region during the fourth time period.

* * * * *